United States Patent
Lee et al.

(10) Patent No.: US 6,772,046 B1
(45) Date of Patent: Aug. 3, 2004

(54) SEMICONDUCTOR FACTORY AUTOMATION SYSTEM AND METHOD FOR MONITORING OPERATIONAL FAILURE OF STOCKER

(75) Inventors: Chang-Jun Lee, Ichon-shi (KR); Kyoung-Jin Seo, Ichon-shi (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 865 days.

(21) Appl. No.: 09/604,304

(22) Filed: Jun. 26, 2000

(30) Foreign Application Priority Data

Jun. 30, 1999 (KR) .................................. 1999-25882

(51) Int. Cl.[7] .............................................. G06F 17/00
(52) U.S. Cl. .................. 700/214; 414/222.01; 414/267; 414/937
(58) Field of Search .................. 700/218, 222, 700/228, 214, 258; 438/5, 7, 10, 14–19; 702/183; 414/222.01, 222.02, 148, 154, 160–164, 270, 273, 274, 279, 289, 937, 939, 940, 267

(56) References Cited

U.S. PATENT DOCUMENTS

| | | | |
|---|---|---|---|
| 4,571,685 A | 2/1986 | Kamoshida | 700/108 |
| 4,901,242 A | 2/1990 | Kotan | 700/108 |
| 5,111,404 A | 5/1992 | Kotani | 700/108 |
| 5,231,585 A | 7/1993 | Kobayashi et al. | 700/96 |
| 5,262,954 A | 11/1993 | Fujino et al. | 700/112 |
| 5,375,062 A | 12/1994 | Aoki | 700/99 |
| 5,381,339 A * | 1/1995 | Yoko et al. | 700/112 |
| 5,402,349 A | 3/1995 | Fujita et al. | 700/97 |
| 5,440,493 A | 8/1995 | Doida | 700/99 |
| 5,495,417 A | 2/1996 | Fuduka et al. | 700/121 |
| 5,555,179 A | 9/1996 | Koyama et al. | 700/95 |
| 5,568,408 A | 10/1996 | Maeda | 702/117 |
| 5,579,231 A | 11/1996 | Sudou et al. | 700/95 |
| 5,596,712 A | 1/1997 | Tsuyama et al. | 714/26 |
| 5,952,681 A * | 9/1999 | Chen | 257/89 |
| 5,997,169 A * | 12/1999 | Watanabe et al. | 700/83 |
| 6,018,688 A * | 1/2000 | Hashimoto | 700/215 |
| 6,129,496 A * | 10/2000 | Iwasaki et al. | 414/222.01 |
| 6,157,866 A * | 12/2000 | Conboy et al. | 700/121 |
| 6,213,853 B1 * | 4/2001 | Gonzalez-Martin et al. | 451/287 |
| 6,216,051 B1 * | 4/2001 | Hager et al. | 700/82 |
| 6,283,692 B1 * | 9/2001 | Perlov et al. | 414/222.01 |
| 6,336,055 B1 * | 1/2002 | Cho | 700/121 |
| 6,418,355 B1 * | 7/2002 | Kondou | 700/213 |

FOREIGN PATENT DOCUMENTS

| | | |
|---|---|---|
| JP | 6-29224 | 2/1994 |
| JP | 2000124290 A * | 10/1998 |

OTHER PUBLICATIONS

Kingroup Automation Industry Corp., "Products our Products" web page.*
Edwards Singal Solutions, "102 series" web page.*
Jimenez et al. "Operational Modeling And Simuation Of An Inter–Bay AMHS In Semiconductor Wafer Fabrication" 2002, Simulation Conference pp. 1377–1382.*

* cited by examiner

Primary Examiner—Leo Picard
Assistant Examiner—Chad Rapp
(74) Attorney, Agent, or Firm—Jacobson Holman PLLC

(57) ABSTRACT

A method for monitoring an operational failure of a stocker for use in a semiconductor factory automation system, wherein the stocker is divided into a plurality of operational parts, includes the steps of: a) generating stocker state information representing an operational state of the stocker in response to a stocker state signal issued from the stocker; b) inspecting the stocker state information to update the operational state of the stocker previously stored; c) generating a warning signal when at least one part contained in the stocker has failed; and d) generating an audiovisual warning sign in response to the warning signal. The method can effectively provide audiovisual warning signs when the stocker has failed.

25 Claims, 5 Drawing Sheets

SEMICONDUCTOR FACTORY AUTOMATION SYSTEM AND METHOD FOR MONITORING OPERATIONAL FAILURE OF STOCKER

FIELD OF THE INVENTION

The present invention relates to a semiconductor factory automation (hereinafter, referred to as FA) system, and, more particularly, to a semiconductor FA system and method for monitoring an operational failure of a stocker.

DESCRIPTION OF THE PRIOR ART

A semiconductor FA system generally includes at least one cell. The cell includes a plurality of semiconductor production bays. One of the semiconductor production bays includes process equipments, stockers and an automatic guide vehicle (hereinafter, referred to as an AGV). A process equipment processes semiconductor wafers to obtain semiconductor devices. The process equipments include an etching equipment, a furnace equipment, a photo-lithography equipment and the like. A stocker temporarily stocks a semiconductor wafer cassette to be transported from a semiconductor production bay to another semiconductor production bay and the semiconductor wafer cassette processed in the process equipment. The semiconductor wafer cassette is a container capable of containing a plurality of semiconductor wafers. The semiconductor wafer cassette processed in the process equipment is transported to the stocker by the AGV, a vehicle, or an operator. The vehicle is employed in transporting the semiconductor wafer cassette from the semiconductor production bay to another semiconductor production bay.

If the stocker has failed, it is impossible to transport the semiconductor wafer cassette to the process equipment or to another semiconductor production bay. Therefore, the operator should continuously check the operational state of the stocker to rapidly report the failure of the stocker to a repairman.

In order to check the operational state of the stocker, the semiconductor FA system includes a stocker monitoring apparatus. The stocker monitoring apparatus has a cell management server (hereinafter, referred to as a CMS) and an operator interface server (hereinafter, referred to as an OIS) connected to the CMS. The CMS receives operational information related to the stocker. The OIS displays the operational state of the stocker on a monitor.

In this case, the operator continuously watches the monitor of the OIS to identify a failed stocker based on the operational information. When the operator identifies the state of the failed stocker, the operator informs a repairman that the stocker has failed. Then, the repairman locates the failed part of the stocker and repairs the failed part of the stocker.

However, when the operator fails to quickly recognize the state of the failed stocker, the failed stocker is left for a long time and, consequently, a semiconductor yield is seriously reduced. Further, when the operator is not sufficiently skilled, a time period required to identify a failed part of the stocker is excessively extended.

Therefore, where a skilled operator should continuously monitor the operational state of the stocker, labor costs increase and, consequently, production costs of the semiconductor devices greatly increase.

SUMMARY OF THE INVENTION

It is, therefore, an object of the present invention to provide a semiconductor FA system and method for monitoring an operational failure of a stocker that is capable of effectively providing audiovisual warning signs when the stocker has failed.

In accordance with an embodiment of an aspect of the present invention, there is provided an apparatus for monitoring an operational failure of at least one stocker for stocking a semiconductor wafer cassette, wherein said stocker is divided into a plurality of parts, comprising: a generation means for generating stocker state information representing an operational state of said stocker in response to a stocker state signal issued from said stocker; a monitoring means for inspecting the stocker state information to update the operational state of said stocker previously stored; and for generating a warning signal when at least one part contained in said stocker has failed; and a warning means for generating an audiovisual warning sign in response to the warning signal.

In accordance with another embodiment of the aspect of the present invention, there is provided a semiconductor factory automation (FA) system, comprising: at least one stocker for stocking a semiconductor wafer cassette, wherein said stocker is divided into a plurality of parts; a generation means for generating stocker state information representing an operational state of said stocker in response to a stocker state signal issued from said stocker; a monitoring means for inspecting the stocker state information to update the operational state of said stocker previously stored; and for generating a warning signal when at least one part contained in said stocker has failed; and a warning means for generating an audiovisual warning sign in response to the warning signal.

In accordance with another aspect of the present invention, there is provided a method for monitoring an operational failure of a stocker for use in a semiconductor factory automation system, wherein the stocker is divided into a plurality of operational parts, comprising the steps of: a) generating stocker state information representing an operational state of the stocker in response to a stocker state signal issued from the stocker; b) inspecting the stocker state information to update the operational state of the stocker previously stored; c) generating a warning signal when at least one part contained in the stocker has failed; and d) generating an audiovisual warning sign in response to the warning signal.

BRIEF DESCRIPTION OF THE DRAWINGS

The above and other objects and features of the present invention will become apparent from the following description of the preferred embodiments given in connection with the accompanying drawings, in which.

DETAILED DESCRIPTION OF THE PREFERRED EMBODIMENTS

Figure 1:
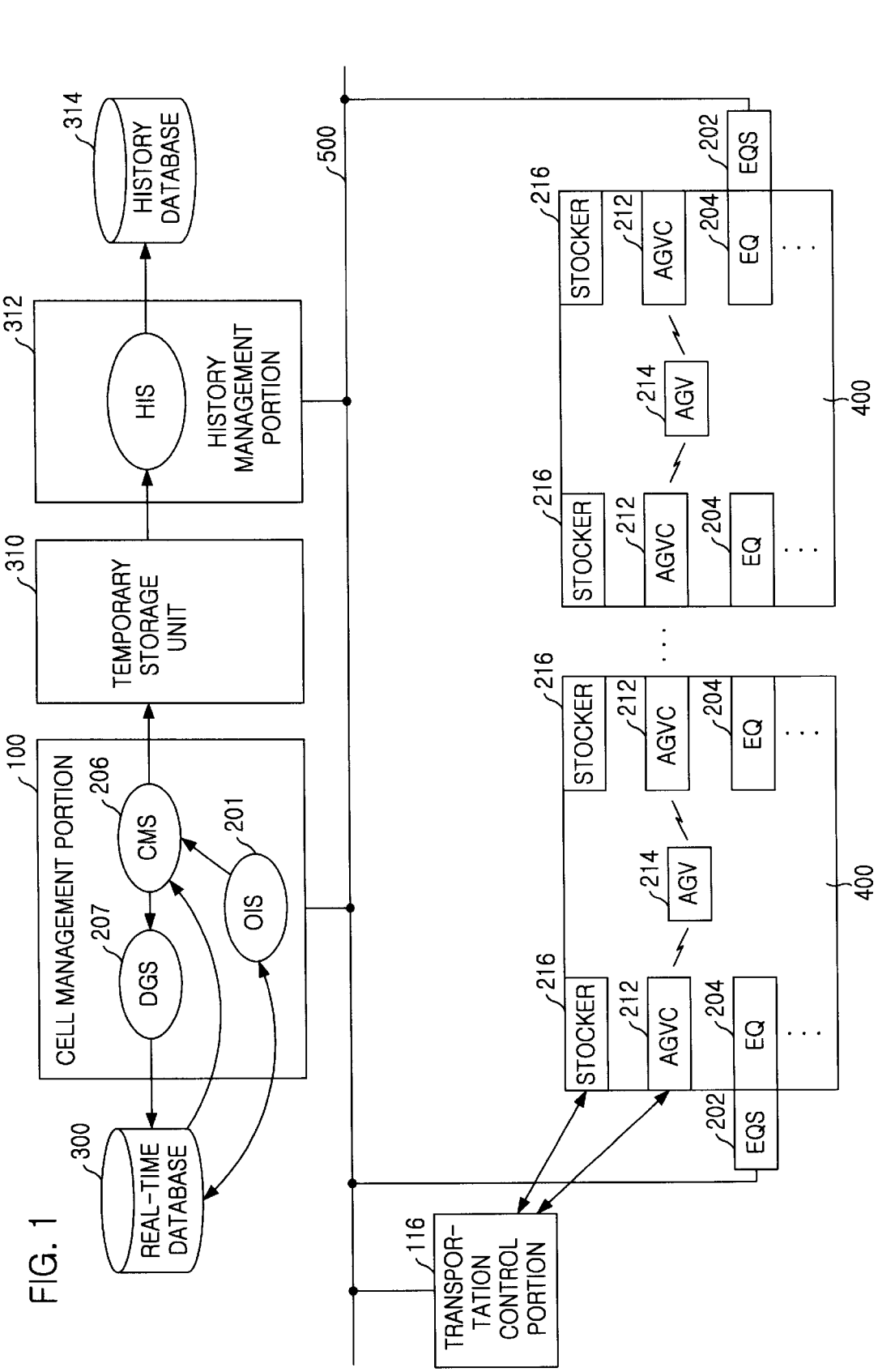
FIG. 1 is a block diagram showing a semiconductor FA system including an apparatus for monitoring an operational failure of a stocker in accordance with a preferred embodiment of the present invention.

Referring to FIG. 1, there is shown a block diagram showing a semiconductor FA system including an apparatus for monitoring an operational failure of a stocker in accordance with the present invention. As shown, the semiconductor FA system includes at least one cell, which has a predetermined number, e.g., 4, of semiconductor production bays. A semiconductor production bay 400 is included in a cell. A semiconductor production bay 400 is provided with process equipments (hereinafter, referred to as EQs) 204, stockers 216 and an AGV 214. The EQ 204 processes semiconductor wafers in order to obtain semiconductor devices. The EQ 204 includes, e.g., an etching equipment, a photo-lithography equipment, a furnace equipment and the like. A stocker 216 temporarily stores a number of semiconductor wafer cassettes. Each of semiconductor wafer cassettes has a predetermined number of semiconductor wafers, which is referred to as a lot. The semiconductor wafer cassettes are selectively transported to the EQ 204 by using the AGV 214. The semiconductor wafer cassette stored in the stocker 216 is transported to another semiconductor production bay 400.

A process equipment server (hereinafter, referred to as an EQS) 202 is coupled to a common communication line 500, e.g., Ethernet™ supplied by Xerox Corporation. An AGV controller (hereinafter referred to as an AGVC) 212 controls the AGV 214.

The semiconductor FA system also includes a cell management portion 100, a real-time database 300 connected to the cell management portion 100, a temporary storage unit 310, a history management portion 312 connected to the temporary storage unit 310 and a history database 314 connected to the history management portion 312. The cell management portion 100, the history management portion 312 and the history database 314 are respectively connected to the common communication line 500 for communication therebetween.

The cell management portion 100 includes a CMS 206, an OIS 201 and a data gathering server (hereinafter, referred to as a DGS) 207. The DGS 207 stores process data associated with the lot in the real-time database 300. The CMS 206 receives information associated with the stocker 216 and inspects new information to check whether the stocker 216 fails. Thereafter, the CMS 206 updates the information associated with the stocker 216 and previously stored on the basis of the new information. If the stocker 216 fails, the CMS 206 generates a predetermined warning signal. Then, the CMS 206 provides the updated information to the OIS 201 and stores the updated information in the real-time database 300.

The OIS 201 has a personal computer (not shown) for processing the information provided by the CMS 206 and operation commands inputted from an operator. The OIS 201 has a monitor 114 for displaying the state information of the stocker 216 on an operator interface screen.

The OIS 201 stores the state information of the stocker 216 in the real-time database 300. The OIS 201 and the CMS 206 can selectively retrieve the state information of the stocker 216 stored in the real-time database 300.

The stocker 216 is adjacent to a buzzer (not shown) and a plurality of light devices (not shown). Also, the buzzer and the light devices are directly connected to the CMS 206. The buzzer and the light devices are controlled by the CMS 206. The buzzer generates an auditory warning sign and the light devices generate various warning light signs. The buzzer and light devices respectively generate the audiovisual warning signs in response to the warning signal issued from the CMS 206. The light devices respectively light black, red, yellow and white light signs.

Figure 2:
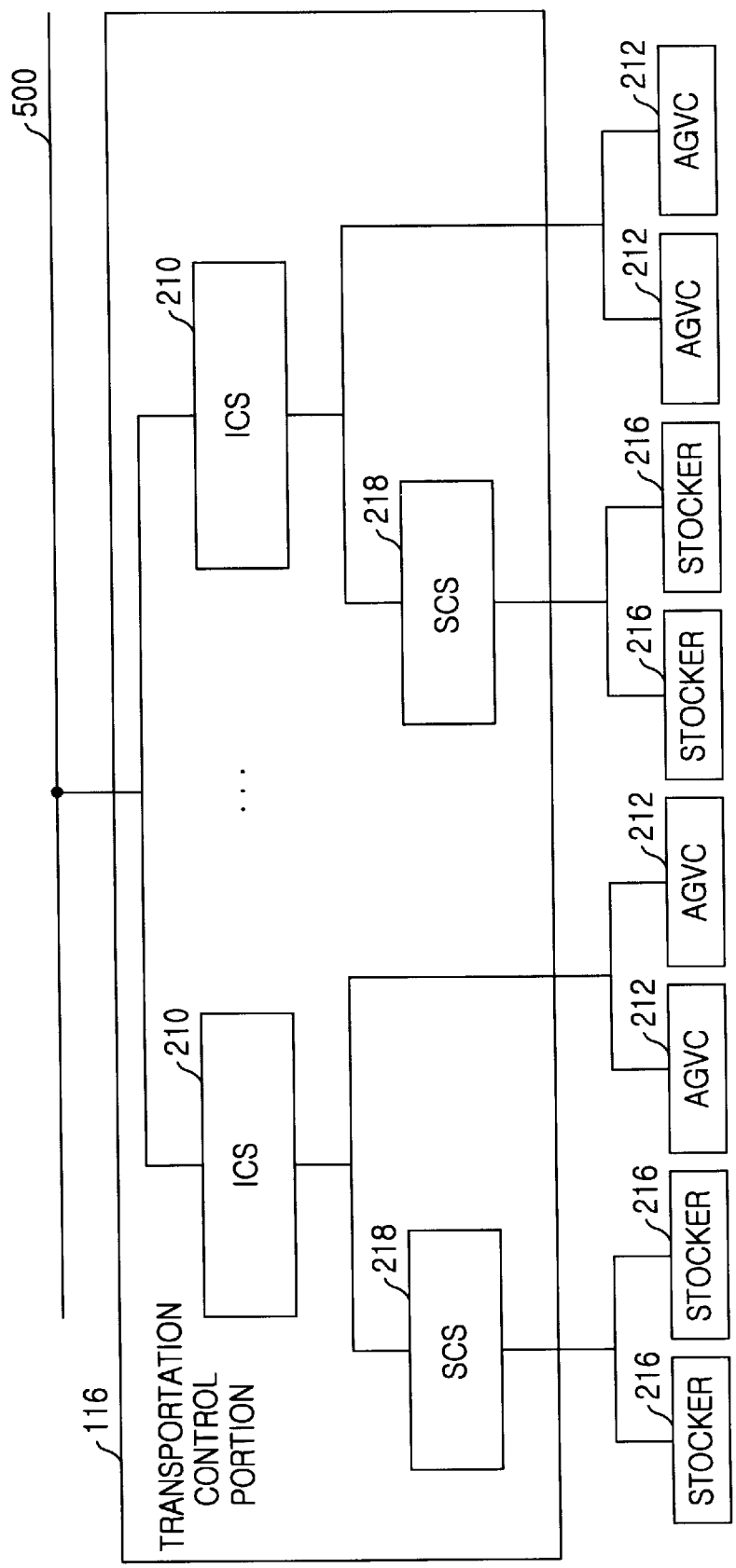
FIG. 2 is a block diagram depicting a transportation control portion shown in FIG. 1.

Referring to FIG. 2, there is shown a block diagram illustrating a transportation control portion shown in FIG. 1. As shown, the transportation control portion 116 includes intrabay control servers (hereinafter, referred to as ICSs) 210 coupled to the common communication line 500 and stocker control servers (hereinafter, referred to as SCSs) 218. The ICS 210 converts a transportation message into a transportation command. The SCS 218 generates a stocker control command to control the stockers 216 in response to the transportation command. The AGVC 212 generates an AGV control command to control an AGV 214 in response to the transportation command.

Figure 3:
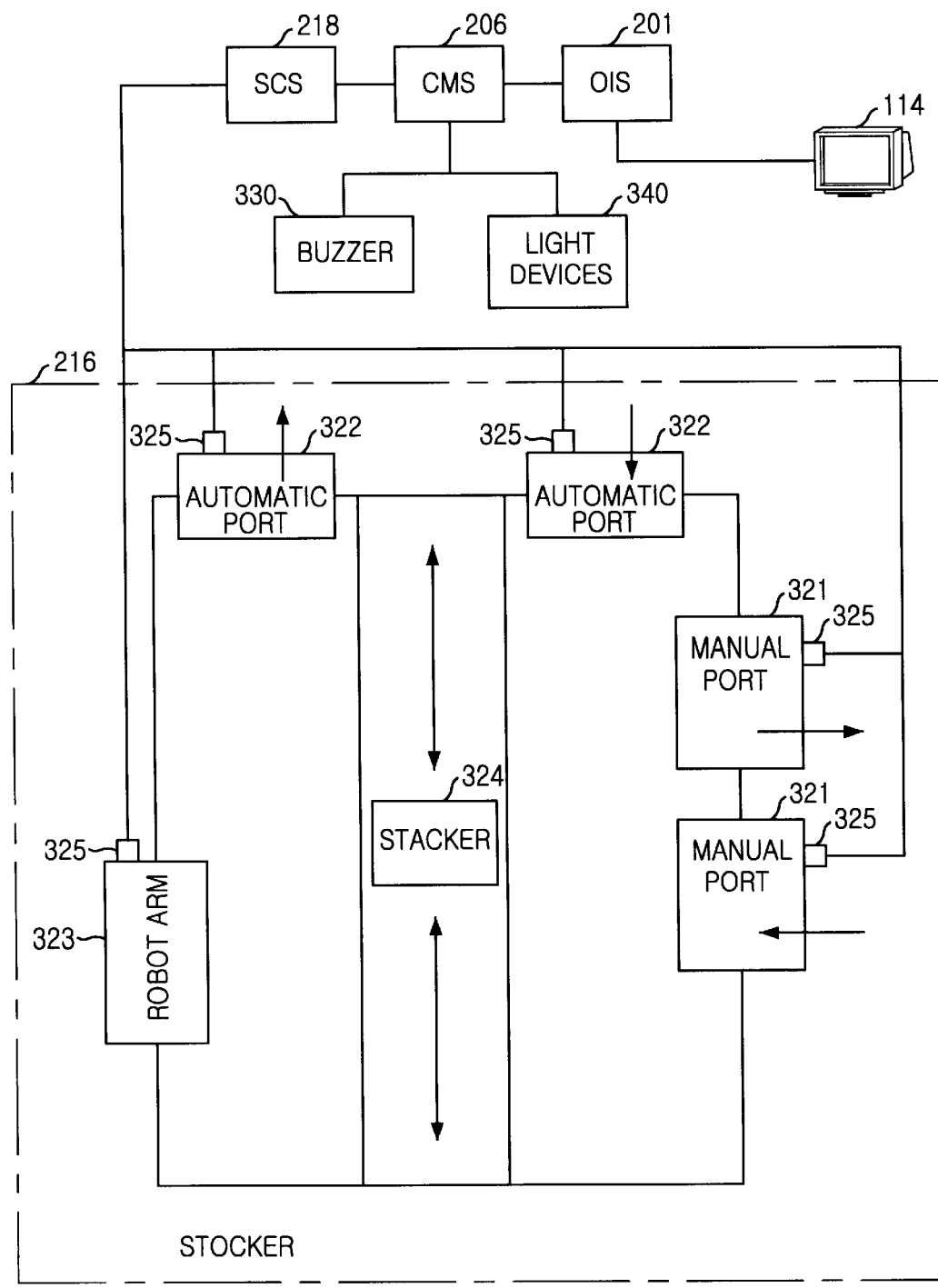
FIG. 3 is a block diagram illustrating an apparatus for monitoring a failure of a stocker in accordance with the preferred embodiment of the present invention.

Referring to FIG. 3, there is shown the stocker monitoring apparatus having one stocker. For the sake of convenience, only one stocker is illustrated in FIG. 3, but actually, a plurality of stockers are connected to the stocker monitoring apparatus. The stocker monitoring apparatus includes the SCS 218, the CMS 206 and the OIS 201, the buzzer 330, the light devices 340 and the monitor 114.

The stocker 216 includes manual ports 321 and automatic ports 322 for loading the semiconductor wafer cassette to the stocker 216 or unloading the semiconductor wafer cassette from the stocker 216. In this embodiment, the manual ports 321 are divided into an input port for loading the semiconductor wafer cassette and an output port for unloading the semiconductor wafer cassette. Similarly, the automatic ports 322 are divided into an input port for loading the semiconductor wafer cassette to the stocker 216 and an output port for unloading the semiconductor wafer cassette from the stocker 216.

The stocker 216 also includes a robot arm 323, a stacker 324 and a plurality of detectors 325. The robot arm 323 pulls the semiconductor wafer cassette out of the stocker 216 or pushes the semiconductor wafer cassette into the stocker 216. The stacker 324 stacks the semiconductor wafer cassette loaded to the automatic ports 322 and the manual ports 321.

The detectors 325 detect a mobility of each of the parts 321 to 324 contained in the stocker 216. The detectors 325 are located at the parts 321 to 324. The detectors 325 further provide a stocker state signal representing operational states of the parts 321 to 324 contained in the stocker 216 to the SCS 218. The SCS 218 controls operations of the parts 321 to 324. The SCS 218 monitors the operational states of the parts 321 to 324. For monitoring the operational states of the parts 321 to 324, the SCS 218 receives the stocker state signal issued from the detectors 325. Then, the SCS 218 generates stocker state information representing the operational state of each of the parts 321 to 324 in response to the stocker state signal. The stocker state information includes identification information representing the stocker 216. The stocker state information also includes various identification information representing the parts 321 to 324 contained in the stocker 216 and flags representing whether the parts 321 to 324 fail. The stocker state information includes the flags of "M", "A", "R", "S" and "0". For example, the "M" denotes a flag of a failed manual port. The "A" denotes a flag of a failed automatic port. The "R" denotes a flag of a failed robot arm. The "S" denotes a flag of a failed stacker. When the parts 321 to 324 contained in the stocker 216 have not failed, all the flags are represented by the "0".

The stocker state information is transmitted from the SCS 218 to the CMS 206. The CMS 206 inspects the operational states of the parts 321 to 324 contained in the stocker 216 by checking the stocker state information to identify whether any part of the stocker 216 has failed or not. If any part of the stocker 216 has failed, the CMS 206 generates the warning signal.

Figure 4:
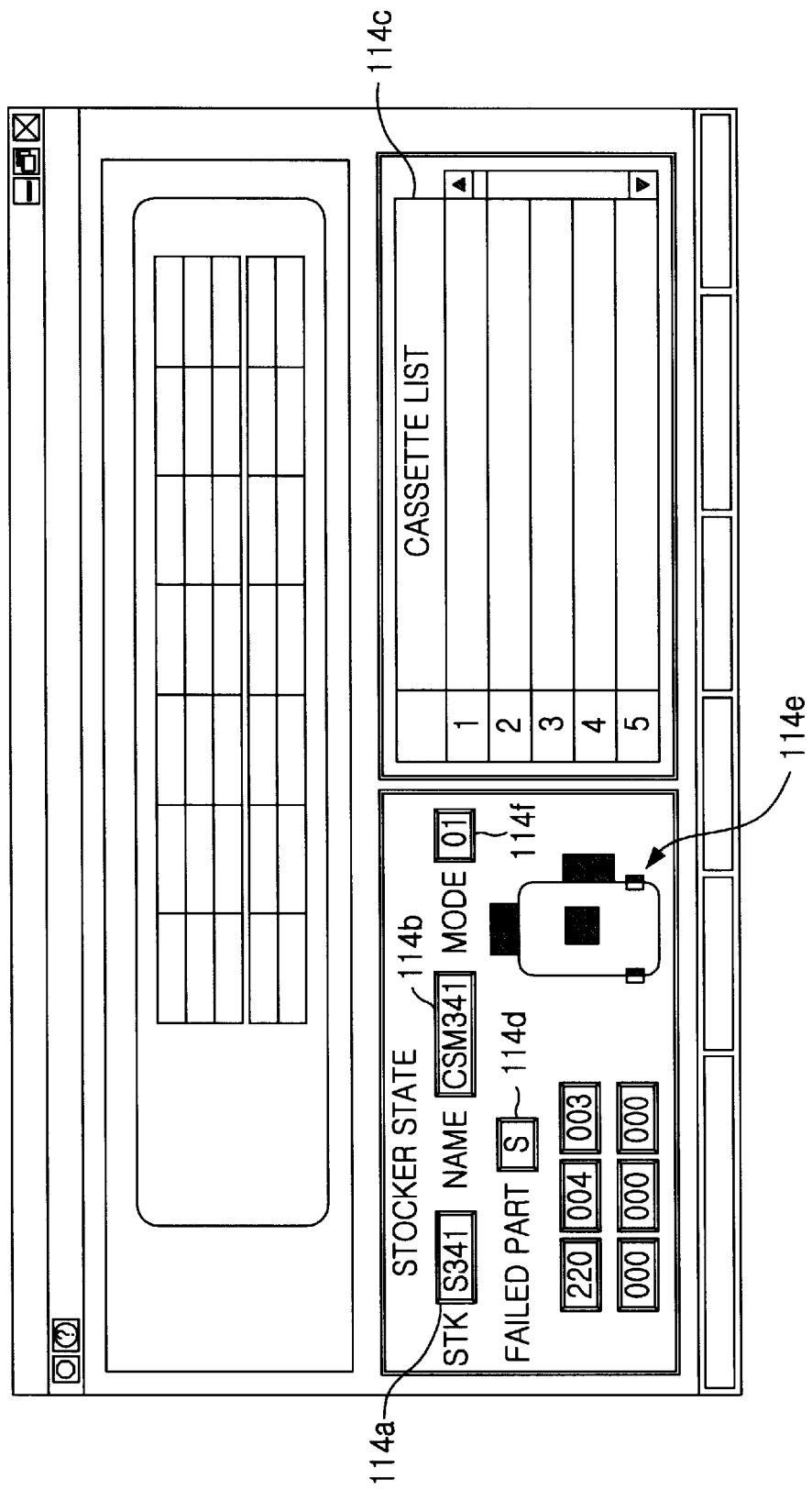
FIG. 4 is an explanatory diagram representing an operator interface screen displayed on a monitor shown in FIG. 3.

Referring to FIG. 4, there is shown an explanatory diagram representing an operator interface screen displayed on a monitor shown in FIG. 3. The warning signal is issued from the CMS 206 to the OIS 201 coupled to the monitor 114. When the manual port 321 has failed, the monitor 114 displays the flag of "M" on a display space 114d of the operator interface screen in response to the warning signal. When the automatic port 322 has failed, the monitor 114 displays the flag of "A" on the display space 114d of the operator interface screen in response to the warning signal. When the robot arm 323 has failed, the monitor 114 displays the flag of "R" on the display space 114d of the operator interface screen in response to the warning signal. When the stacker 324 has failed, the monitor 114 displays the flag of "S" on the display space 114d of the operator interface screen in response to the warning signal. The monitor 114 displays a stocker number, e.g., "S341", on a display space 114a of the operator interface screen. The monitor 114 displays a stocker name, e.g., "CSM341", on a display space 114b of the operator interface screen. The monitor 114 displays a stocker mode, e.g., "01" or "02", on a display space 114f of the operator interface screen, wherein the stocker mode of "01" denotes an online mode and the stocker mode of "02" denotes an offline mode.

Also, the monitor 114 displays a list of the semiconductor wafer cassettes stocked in the stocker 216 on a display space 114c of the operator interface screen. When the parts contained in the stocker 216 have not failed, the monitor 114 displays green light signs on a display space 114e of the operator interface screen.

When the manual port 321 contained in the stocker 216 has failed, the monitor 114 displays a white light sign on the display space 114e of the operator interface screen. When the automatic port 322 contained in the stocker 216 has failed, the monitor 114 displays a yellow light sign on the display space 114e of the operator interface screen. When the robot arm 323 contained in the stocker 216 has failed, the monitor 114 displays a red light sign on the display space 114e of the operator interface screen. When the stacker 324 contained in the stocker 216 has failed, the monitor 114 displays a black light sign on the display space 114e of the operator interface screen.

Figure 5:
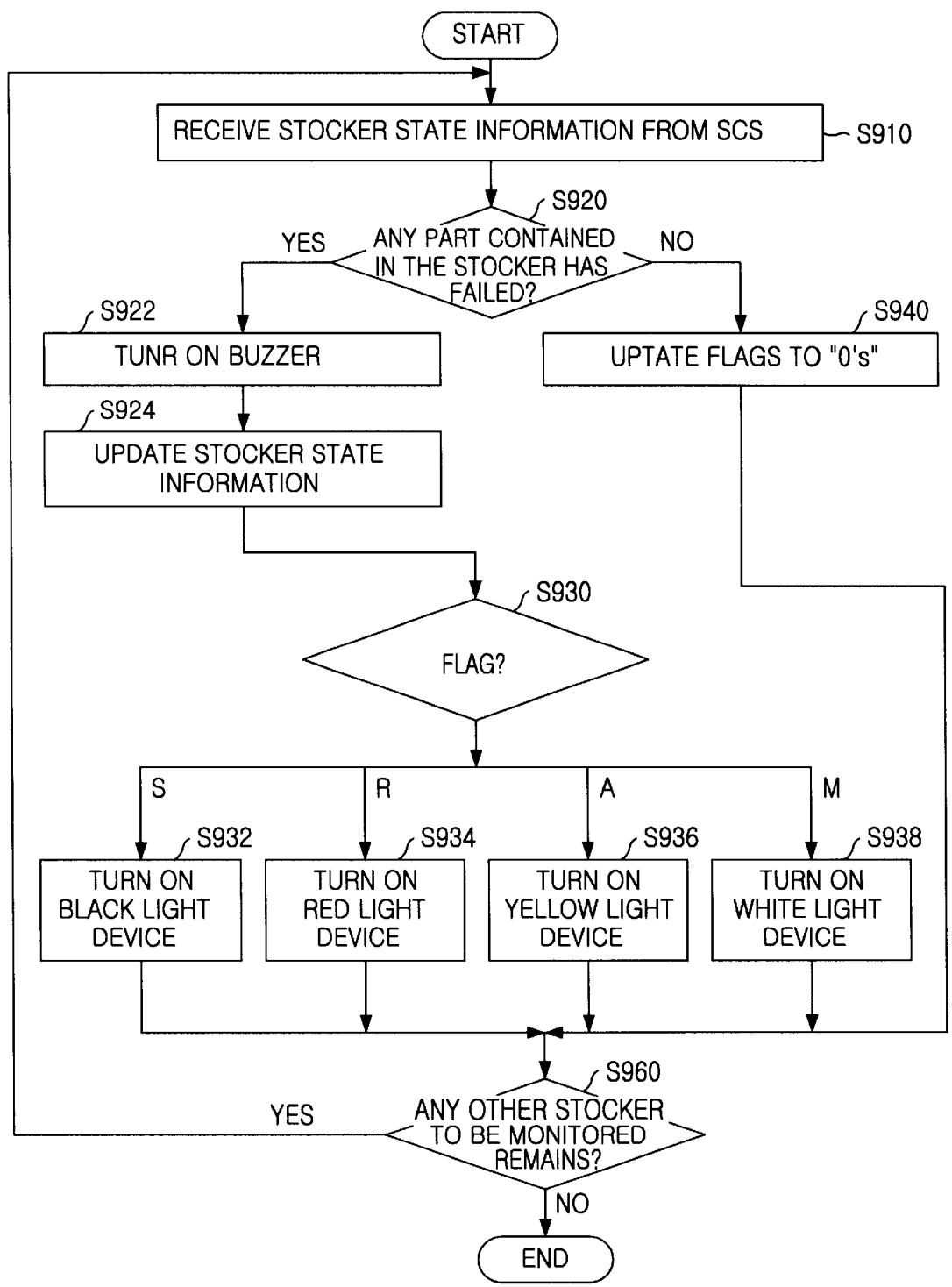
FIG. 5 is a flowchart showing a method for monitoring an operational failure of a stocker in a semiconductor FA system in accordance with the present invention.

Referring to FIG. 5, there is shown a flowchart showing a method for monitoring an operational failure of a stocker in a semiconductor FA system in accordance with the present invention.

At step S910, the CMS 206 receives stocker state information issued from the SCS 218.

At step S920, the CMS 206 determines whether any part contained in the stocker 216 has failed in response to the stocker state information.

At step S922, if any part contained in the stocker 216 has failed, the CMS 206 generates a warning signal to turn on the buzzer 330.

At step S924, the CMS 206 updates the stocker state information previously stored and provides the updated stocker state information to the OIS 201. In this case, the flags related to the parts 321 to 324 contained in the stocker 216 are updated in the OIS 201.

At step S930, the CMS 206 determines a type of a flag to inspect the updated stocker state information.

At step S932, if the flag contained in the updated stocker state information is "S", the CMS 206 turns on a black light device.

At step S934, if the flag contained in the updated stocker state information is "R", the CMS 206 turns on a red light device.

At step S936, if the flag contained in the updated stocker state information is "A", the CMS 120 turns on a yellow light device.

At step S938, if the flag contained in the updated stocker state information is "M", the CMS 206 turns on a white light device. In accordance with the operational state of the stocker 216, two or more light devices can be simultaneously turned on. When the manual port 321 contained in the stocker 216 has failed, the monitor 114 displays a white light sign on the display space 114e of the operator interface screen. When the automatic port 322 contained in the stocker 216 has failed, the monitor 114 displays a yellow light sign on the display space 114e of the operator interface screen. When the robot arm 323 contained in the stocker 216 has failed, the monitor 114 displays a red light sign on the display space 114e of the operator interface screen. When the stacker 324 contained in the stocker 216 has failed, the monitor 114 displays a black light sign on the display space 114e of the operator interface screen.

At step S940, the CMS 206 updates the flags related to the parts 321 to 324 contained in the stocker 216 to 0's.

At step S960, the CMS 206 determines whether any other stocker 216 to be monitored remains. If any other stocker 216 to be monitored remains, the steps S910 to S960 are repeated.

In accordance with the present invention, the method for monitoring the stocker reduces unnecessary labor costs by generating the audiovisual warning signs related to the failure of the stocker 216. Also, since the operator interface screen effectively displays the failed parts contained in the stocker, the time period needed to repair a failed stocker is reduced. Therefore, the semiconductor yield can greatly increase.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for monitoring an operational failure of at least one stocker for stocking a semiconductor wafer cassette, wherein said stocker is divided into a plurality of parts, comprising:

a generation means for generating stocker state information representing an operational state of said stocker in response to a stocker state signal issued from said stocker, said stocker state information including identification information representing said stocker; identification information representing at least one part contained in said stocker; and a flag representing whether at least one part contained in said stocker has failed;

a monitoring means for inspecting the stocker state information to update the operational state of said stocker previously stored; and for generating a warning signal when at least one part contained in said stocker has failed; and a warning means for generating an audiovisual warning sign in response to the warning signal.

2. The apparatus as recited in claim 1, wherein said warning means includes:

an auditory warning means for generating an auditory warning sign in response to the warning signal; and a visual warning means for generating a plurality of visual warning signs in response to the warning signal.

3. The apparatus as recited in claim 2, wherein said auditory warning means includes:
a buzzer for generating an alarm in response to the warning signal.

4. The apparatus as recited in claim 3, wherein said visual warning means includes:
a plurality of light devices for lighting light signs in response to the warning signal.

5. The apparatus as recited in claim 4, wherein said stocker includes:
a plurality of manual and automatic port means for loading the semiconductor wafer cassette to said stocker or unloading the semiconductor wafer cassette from the said stocker;
a robot arm means for pulling the semiconductor wafer cassette out of said stocker or pushing the semiconductor wafer cassette into said stocker;
a stacking means for stacking the semiconductor wafer cassette; and
a plurality of detecting means for detecting a mobility of each of said manual and automatic port means, said robot arm means, and said stacking means to provide the stocker state signal to said generation means.

6. The apparatus as recited in claim 5, further comprising:
an operator interface means, coupled to said monitoring means, for displaying the stocker state information.

7. The apparatus as recited in claim 1, wherein the flag includes first, second, third and fourth flags.

8. The apparatus as recited in claim 7, wherein the first flag denotes the flag of the manual port means failed; and wherein the second flag denotes the flag of the automatic port means failed; and wherein the third flag denotes the flag of said robot arm means failed; and wherein the fourth flag denotes the flag of said stacking means failed.

9. The apparatus as recited in claim 8, wherein said operator interface means includes:
a first display space for displaying a white light sign when said manual port means fails;
a second display space for displaying a yellow light sign when said automatic port means fails;
a third display space for displaying a red light sign when said robot arm means fails; and
a fourth display space for displaying a black light sign when said stacking means fails.

10. The apparatus as recited in claim 4, wherein said light devices include:
a first light device for lighting a white light sign in response to the warning signal;
a second light device for lighting a yellow light sign in response to the warning signal;
a third light device for lighting a red light sign in response to the warning signal; and
a fourth light device for lighting a black light sign in response to the warning signal.

11. A semiconductor factory automation (FA) system, comprising:
at least one stocker for stocking a semiconductor wafer cassette, wherein said stocker is divided into a plurality of parts;
a generation means for generating stocker state information representing an operational state of said stocker in response to a stocker state signal issued from said stocker, said stocker state information including identification information representing said stocker; identification information representing at least one part contained in said stocker; and a flag representing whether at least one part contained in said stocker has failed;
a monitoring means for inspecting the stocker state information to update the operational state of said stocker previously stored; and for generating a warning signal when at least one part contained in said stocker has failed; and
a warning means for generating an audiovisual warning sign in response to the warning signal.

12. The semiconductor FA system as recited in claim 11, further comprising:
a plurality of semiconductor processing means each for carrying out a predetermined semiconductor process, wherein the predetermined semiconductor process is applied to semiconductor wafers contained in the semiconductor wafer cassette; and
a transportation means for transporting the semiconductor wafer cassette from each semiconductor processing means to said stocker or from said stocker to each semiconductor processing means.

13. The semiconductor FA system as recited in claim 11, wherein said warning means includes:
an auditory warning means for generating an auditory warning sign in response to the warning signal; and
a visual warning means for generating a plurality of visual warning signs in response to the warning signal.

14. The semiconductor FA system as recited in claim 13, wherein said auditory warning means includes:
a buzzer for generating an alarm in response to the warning signal.

15. The semiconductor FA system as recited in claim 14, wherein said visual warning means includes:
a plurality of light devices for lighting light signs in response to the warning signal.

16. The semiconductor FA system as recited in claim 15, wherein said stocker includes:
a plurality of manual and automatic port means for loading the semiconductor wafer cassette to said stocker or unloading the semiconductor wafer cassette from the said stocker;
a robot arm means for pulling the semiconductor wafer cassette out of said stocker or pushing the semiconductor wafer cassette into said stocker;
a stacking means for stacking the semiconductor wafer cassette; and
a plurality of detecting means for detecting a mobility of each of said manual and automatic port means, said robot arm means, and said stacking means to provide the stocker state signal to said generation means.

17. A method for monitoring an operational failure of a stocker for use in a semiconductor factory automation system, wherein the stocker is divided into a plurality of operational parts, comprising the steps of:
a) generating stocker state information representing an operational state of the stocker in response to a stocker state signal issued from the stocker, said stocker state information including identification information representing said stocker; identification information representing at least one part contained in said stocker; and a flag representing whether at least one part contained in said stocker has failed;
b) inspecting the stocker state information to update the operational state of the stocker previously stored;

c) generating a warning signal when at least one part contained in the stocker has failed; and d) generating an audiovisual warning sign in response to the warning signal.

18. The method as recited in claim 17, wherein said step d) includes the steps of:

d1) generating an auditory warning sign in response to the warning signal; and d2) generating a plurality of visual warning signs in response to the warning signal.

19. The method as recited in claim 18, wherein said step d1) includes the step of generating an alarm as the auditory warning sign in response to the warning signal by employing a buzzer.

20. The method as recited in claim 19, wherein said step d2) includes the step of lighting light signs as the visual warning signs in response to the warning signal by employing a plurality of light devices.

21. The method as recited in claim 20, further comprising the step of:

e) displaying the stocker state information.

22. The method as recited in claim 17, wherein the flag includes first, second, third and fourth flags.

23. The method as recited in claim 22, wherein the first flag denotes the flag of a manual port failed; and wherein the second flag denotes the flag of an automatic port failed; and wherein the third flag denotes the flag of a robot arm failed; and wherein the fourth flag denotes the flag of a stacker failed.

24. The method as recited in claim 23, wherein said step e) includes the steps of:

e1) displaying a white light sign when the manual port fails;

e2) displaying a yellow light sign when the automatic port fails;

e3) displaying a red light sign when the robot arm fails; and e4) displaying a black light sign when the stacker fails.

25. The method as recited in claim 20, wherein said step d2) include the steps of:

d2-a) lighting a white light sign in response to the warning signal;

d2-b) lighting a yellow light sign in response to the warning signal;

d2-c) lighting a red light sign in response to the warning signal; and d2-d) lighting a black light sign in response to the warning signal.

* * * * *